US006417626B1

(12) United States Patent
Brcka et al.

(10) Patent No.: US 6,417,626 B1
(45) Date of Patent: Jul. 9, 2002

(54) IMMERSED INDUCTIVELY—COUPLED PLASMA SOURCE

(75) Inventors: Jozef Brcka, Gilbert, AZ (US); John Drewery, Alameda, CA (US); Michael Grapperhaus, Gilbert, AZ (US); Gerrit Leusink, Tempe, AZ (US); Glyn Reynolds; Mirko Vukovic, both of Gilbert, AZ (US); Tugrul Yasar, Scottsdale, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/796,971

(22) Filed: Mar. 1, 2001

(51) Int. Cl.[7] .................................................. H01J 7/24
(52) U.S. Cl. .............................. 315/111.51; 315/111.21; 118/723 I; 118/715; 204/298.15; 204/671
(58) Field of Search ....................... 315/111.21, 111.51, 315/111.71; 118/723 I, 723 R, 733, 715, 50; 204/192.32, 298.11, 298.15, 298.41, 671

(56) References Cited

U.S. PATENT DOCUMENTS

| 5,226,967 A | 7/1993 | Chen et al. ................. 118/723 |
| 5,309,063 A | 5/1994 | Singh ..................... 315/111.51 |
| 5,368,710 A | 11/1994 | Chen et al. ............. 204/192.32 |
| 5,556,521 A | 9/1996 | Ghanbari ............... 204/192.32 |
| 6,076,482 A | 6/2000 | Ding et al. .................. 118/723 |
| 6,197,165 B1 * | 3/2001 | Drewery et al. ....... 204/192.12 |
| 6,287,435 B1 * | 9/2001 | Drewery et al. ....... 204/298.06 |

* cited by examiner

Primary Examiner—Haissa Philogene
(74) Attorney, Agent, or Firm—Wood, Herron & Evans, L.L.P.

(57) ABSTRACT

A plasma processing system having a plasma source that efficiently couple radiofrequency energy to a plasma within a vacuum processing space of a vacuum chamber. The plasma source comprises a dielectric trough, an inductive element, and a pair of slotted deposition shields. A chamber wall of the vacuum chamber includes an annular opening that receives the dielectric trough. The trough projects into the vacuum processing space to immerse the inductive element within the plasma. The spatial distribution of the RF energy inductively coupled from the inductive element to the plasma may be tailored by altering the slots in the slotted deposition shields, the configuration of the inductive element, and the thickness or geometry of the trough. The efficient inductive coupling of radiofrequency energy is particularly effective for creating a spatially-uniform large-area plasma for the processing of large-area substrates.

46 Claims, 8 Drawing Sheets

IMMERSED INDUCTIVELY— COUPLED PLASMA SOURCE

FIELD OF THE INVENTION

This invention relates generally to radiofrequency plasma processing systems and, more particularly, relates to plasma sources for radiofrequency plasma processing systems which improve the efficiency of inductive coupling of radiofrequency energy to the plasma.

BACKGROUND OF THE INVENTION

Plasmas are widely used in integrated circuit fabrication to modify the surfaces of semiconductor substrates, such as silicon wafers, and in other applications to modify the surfaces of workpieces, such as flat panel displays. Familiar plasma processes include sputter etching, reactive ion etching, ionized physical vapor deposition, plasma-enhanced chemical vapor deposition, surface conditioning, and surface cleaning. Plasma processing generally removes or adds a layer of a material to the substrate, or a patterned area on the surface of the substrate, by either etching, sputtering, growing, or depositing, or chemically modifies a thin surface layer.

Plasmas are generated by coupling excitation energy from an energy source with a sub-atmospheric or vacuum pressure of a process gas confined inside a vacuum chamber. In a widely-practiced method of generating a plasma, radiofrequency (RF) electrical energy is coupled with the process gas to create a rapidly oscillating (i.e., time-varying) electromagnetic field. The oscillating electromagnetic field precipitates a circulating flow of electrons that, in a cascade of individual electron-gas molecule collisions, ionizes the process gas. The plasma of positively and negatively charged particles is sustained by coupling between the RF electromagnetic field and the electrical load presented by the plasma.

Highly-dense plasmas may be generated by inductively coupling the magnetic field component of the RF electromagnetic field to the plasma into the vacuum chamber. Structure, such as a slotted electrostatic shield or a deposition shield, is typically incorporated into an inductively-coupled plasma (ICP) processing system which suppresses capacitive-coupling of the RF energy to the plasma. The deposition shield preferentially transmits the inductively-coupled magnetic component of the RF energy. Inductively-coupled plasmas generally have a low plasma potential. In an ICP processing system, the plasma potential is determined by the characteristics of the electrons in the bulk plasma, which is surrounded by the grounded deposition shield and chamber wall of the vacuum chamber. The ICP processing system lacks active electrodes either inside the vacuum chamber or interfacing with the plasma that could cause time-dependent fluctuations in the level of the plasma potential. Thus, the plasma potential is an intrinsic property of the inductively-coupled plasma and a greater level of RF energy may be inductively coupled with the plasma for enhancing the ion density while retaining a relatively low plasma potential.

In the operation of an ICP processing system, a negative bias potential is usually applied to the substrate support to increase the sheath voltage at the substrate and attract positive ions from the plasma to the substrate. The bias potential effectively determines the kinetic energy of the ions striking the substrate. Thus, the kinetic energy of the positive ions striking the substrate surface is essentially independent of the ion density in an ICP processing system. Accordingly, the surface of the substrate is not damaged by highly energetic ions characteristic of a capacitively-coupled plasma.

Conventional ICP processing systems have a plasma source that may include an antenna or inductive element positioned outside a vacuum chamber and an RF-transmissive window interfacing with the vacuum processing space inside the vacuum chamber. The inductive element is operable for radiating RF energy that is transmitted through the RF-transmissive window to couple with a plasma in the vacuum processing space. The RF-transmissive window is formed of a dielectric material and is incorporated in a vacuum-tight fashion into a structural wall of the vacuum chamber. The surface of the RF-transmissive window is shielded from interactions with the plasma by the deposition shield. The inductive element may be wrapped in a solenoidal fashion about the circumference of a cylindrical RF-transmissive window incorporated into the sidewall of the vacuum chamber. Alternatively, the inductive element may be disposed in a suitable pattern adjacent to a planar RF-transmissive window positioned in the ceiling of the chamber. The thickness of the dielectric material constituting the RF-transmissive window must suffice to withstand the significant forces arising from atmospheric pressure acting over the surface area of the window. In particular, a planar RF-transmissive window must be thick enough to be self-supporting. As a result, a thick RF-transmissive window increases the separation distance between the inductive element and the plasma so as to significantly reduce the amount of RF energy inductively-coupling with the plasma.

In other conventional ICP processing systems, the RF-transmissive window is eliminated or, at the least, minimized by positioning the inductive element within the vacuum chamber. Because the inductive element is closer to the plasma, the efficiency of the inductive coupling of RF energy with the plasma is enhanced over those conventional ICP processing systems that rely upon transmission of RF energy from an external inductive element through a thick RF-transmissive window. However, positioning the inductive element within the vacuum chamber exposes the surfaces of the inductive element to the plasma. Material sputtered from the inductive element may unwantedly deposit on the substrate or other sensitive surfaces within the vacuum chamber. One attempted solution was to form the inductive element from the intended material being deposited onto the substrate as part of the plasma processing. However, this remedy significantly limits the design of the inductive element, restricts the range of materials that can be processed, and may result in plasma-related failures of the inductive element. Further, situating the inductive element within the vacuum chamber significantly increases the complexity of the overall design of the ICP processing system and, if a coolant fluid is circulated through the inductive element, significantly increases the risk of a fluid leak that would compromise the chamber vacuum.

Most planar ICP processing systems incorporate an inductive element that has a footprint commensurate with the area of the substrate to be processed. The semiconductor industry has a need to migrate toward larger area substrates, such as 300 mm silicon wafers and, eventually, larger diameter wafers. Therefore, the inductive element and the RF transmissive window must extend over a large planar area to provide a substantially spatially-uniform distribution of RF energy to a voluminous processing space. As device densities and feature sizes decrease and substrate sizes increase, the ability to produce a highly-dense and uniform plasma throughout the entire processing space increases in importance and becomes increasingly challenging with regard to system design. Because the configuration of the plasma source determines the spatial distribution of the RF energy, the plasma source is the principle factor in determining the plasma density for plasma processing or plasma-assisted processing over the surface area of the substrate and, ultimately, the process throughput and the device yield.

Due to various deficiencies, conventional plasma sources are unable to adequately satisfy the requirements for processing substrates of a large surface area. For example, conventional plasma sources configured to generate a plasma for processing a large-area substrate cannot maximize the energy coupled with the plasma due to, among other factors, the presence of the thick RF-transmissive window. Because the RF-transmissive window forms a self-supporting portion of the chamber wall, its thickness must be able to resist the forces of the external atmospheric pressure. As the surface area of the RF-transmissive window increases that is exposed to the pressure differential between the chamber vacuum and atmospheric pressure, the dielectric material constituting the window must be thickened. As the thickness increases, the RF power must be increased to the inductive element to compensate for the spatial energy losses. Thus, the inability to provide a highly-efficient plasma source for processing large-area substrates is a significant shortcoming that hinders the full development of ICP processing systems.

As a result of the above and other considerations and problems, there remains a need for an inductively-coupled plasma source with efficient and uniform inductive coupling of a density distribution of RF energy for creating a spatially-uniform plasma for the plasma processing of large-area substrates.

SUMMARY OF THE INVENTION

The present invention, in one embodiment, provides a system for processing a substrate with a plasma. The processing system comprises a vacuum chamber having a chamber wall which surrounds a vacuum processing space and a gas inlet for introducing a process gas into the vacuum processing space. A substrate support is positioned within the vacuum processing space and is adapted to receive and support the substrate. The chamber wall has an annular opening that receives an annular dielectric trough in a vacuum-tight fashion. Within the vacuum chamber, an inner deposition shield having a plurality of first slots extending therethrough is adjacent an inner dielectric wall of the trough and an outer deposition shield having a plurality of second slots extending therethrough is adjacent an outer dielectric wall of the trough. An inductive element is positioned within the trough and is operably connected to a radiofrequency (RF) energy source. The inductive element couples RF energy through the inner and outer dielectric walls of the trough and the inner and outer deposition shields into the vacuum processing space.

The present invention also provides a plasma source for coupling RF energy from an RF energy source to a plasma confined within a vacuum processing space. The vacuum processing space is surrounded by a chamber wall of a vacuum chamber. The plasma source comprises an annular dielectric trough positioned in an annular opening in the chamber wall in a vacuum-tight fashion. An inner deposition shield is adjacent an inner dielectric wall of the trough and within the vacuum chamber, wherein the inner deposition shield has a plurality of first slots extending therethrough. An outer deposition shield is adjacent the outer dielectric wall and within the vacuum chamber, wherein the outer deposition shield has a plurality of second slots extending therethrough. An inductive element is positioned within the trough and is operably connected to the RF energy source for coupling RF energy through the inner and outer dielectric walls of the trough and the inner and outer deposition shields to the plasma in the vacuum processing space.

The present invention provides an apparatus for generating a dense, uniform plasma in the vacuum processing space by geometrically immersing the plasma source within the plasma. According to the present invention, the immersed plasma sources efficiently couple RF energy to the plasma for enhancing the characteristics of the plasma. The present invention permits the spatial tailoring of the distribution of the RF energy coupled to the plasma to provide a uniform, high density plasma suitable for processing large-area substrates. The present invention provides dense, uniform plasmas while affording a rigid vacuum chamber and locating all water cooling and RF electrical connections outside of the vacuum chamber. Further, the present invention does not require a self-supporting dielectric window that must withstand the significant pressure differential between the interior of the vacuum chamber and atmospheric pressure. These advantages and other advantages of the present invention are set forth in the detailed description hereinbelow.

BRIEF DESCRIPTION OF THE DRAWINGS

The accompanying drawings, which are incorporated in and constitute a part of this specification, illustrate embodiments of the present invention and, together with a detailed description of the invention given below, serve to explain the present invention. In the drawings wherein like reference numerals represent like parts.

DETAILED DESCRIPTION OF THE INVENTION

A plasma source according to the present invention is utilized to inductively couple radiofrequency (RF) energy into a processing chamber, for igniting and sustaining an inductively coupled plasma (ICP) to process a substrates, such as semiconductor wafers and workpieces of other compositions and geometries. Plasma processing is widely used in the fabrication of integrated circuits to process, modify or treat the surface of the substrate by processes such as sputter etching, plasma-enhanced chemical vapor deposition (PECVD), ionized physical vapor deposition (IPVD), and reactive ion etching (RIE). A plasma source in accordance with the present invention permits efficient inductive coupling of RF energy to initiate and sustain a highly dense plasma by embedding the plasma source within the plasma. As used herein, the term "dense plasma" is intended to refer to a plasma having high electron and ion densities. Further, a plasma source in accordance with the present invention permits the coupling of the RF energy to be spatially tailored for spatially varying the density distribution of the electromagnetic energy and optimizing the spatially uniformity of the plasma density distribution.

Figure 1:
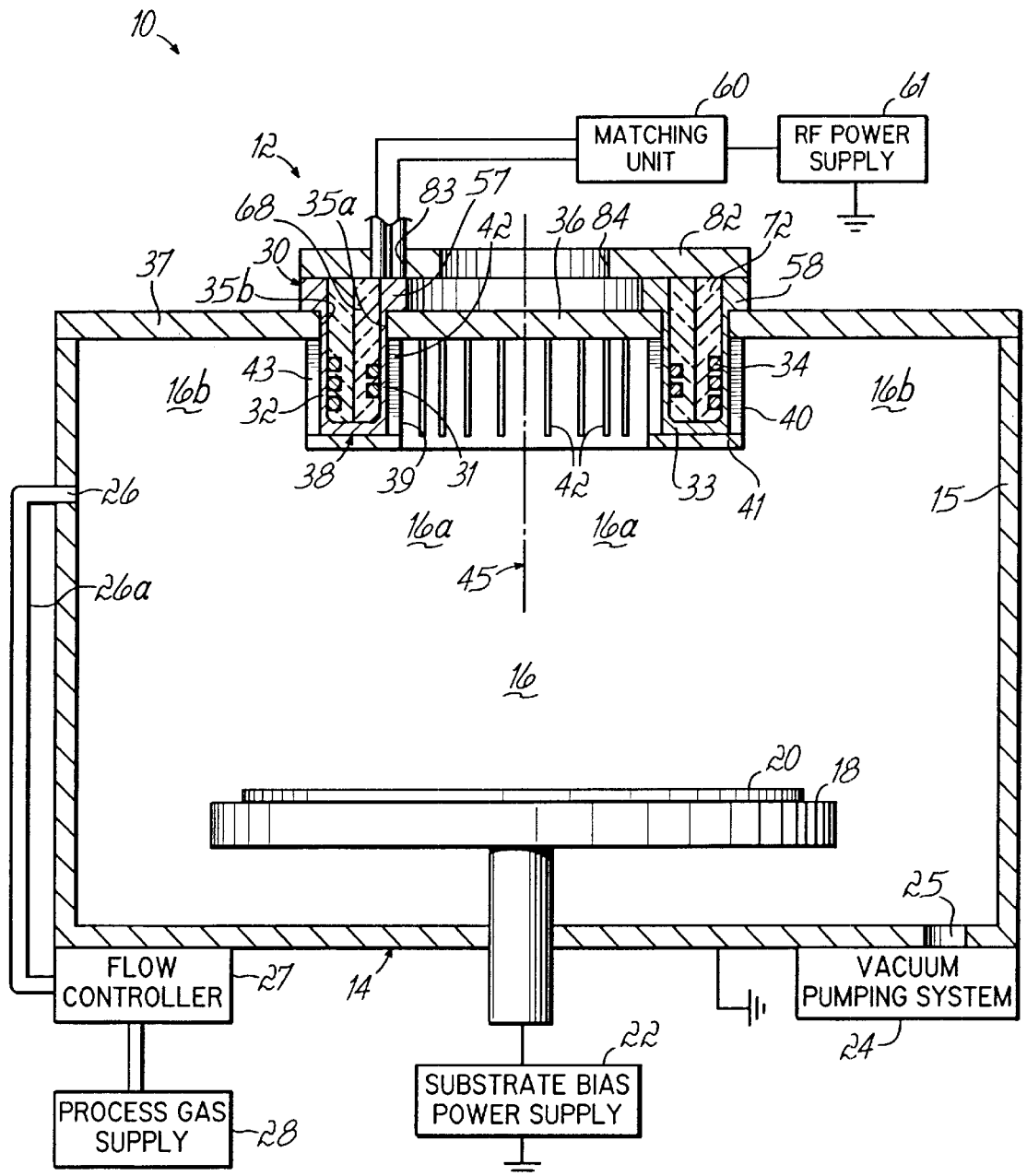
FIG. 1 is a side cross-sectional view of a plasma processing system in accordance with the principles of the present invention.

Referring to FIG. 1, an ICP plasma processing system, indicated generally by reference numeral 10, incorporates a plasma source, indicated generally by reference numeral 12, constructed according to the present invention. Processing system 10 is suitable for use with various of the plasma sources described herein and is not limited to use with plasma source 12. Processing system 10 includes a vacuum chamber 14 having a chamber wall 15 formed of a nonmagnetic and electrically-conductive material, such as, for example, an aluminum alloy. Chamber wall 15 surrounds an interior volume that furnishes a vacuum processing space 16. A substrate support 18 is positioned within vacuum processing space 16. Substrate support 18 is configured to receive and support a substrate 20, such as, for example, a silicon wafer or a gallium arsenide wafer. The substrate 20 is typically clamped or chucked to the substrate support 18, which is supported by, but electrically insulated from, the chamber wall 15. Substrate support 18 may be, for example, a temperature-controlled electrostatic chuck adapted to heat and cool substrate 20.

A substrate-bias power supply 22, which is typically an RF source, is operably coupled to the substrate support 18 to apply a negative bias potential to the substrate 20. The bias potential adjusts the sheath voltage at the substrate 20 for controlling the kinetic energies of charged particles, such as positive ions, attracted from the high density plasma to strike the substrate 20. For certain plasma processes such as IPVD, the charged particles attracted by the bias potential to substrate 20 are generated by interactions between the plasma and neutral or lightly-charged particles, such as particles of coating material.

A vacuum pumping system 24 is operably connected for fluid communication through a vacuum port 25 provided in the chamber wall 15. Vacuum pumping system 24 is operable for evacuating processing space 16 and maintaining a vacuum or subatmospheric pressure appropriate for initiating and sustaining a plasma in vacuum processing space 16. Suitable vacuum pumping systems 24 are familiar to those of ordinary skill in the art of plasma processing. A gas inlet 26 is coupled via a gas conduit 26a and a flow controller 27 to a process gas supply 28 for supplying a process gas, such as argon, to the processing space 16. Flow controller 27 establishes the flow rate of process gas to the gas inlet 26. After processing space 16 is evacuated to a base vacuum pressure, process gas is supplied through gas inlet 26 to establish an operating vacuum pressure in the range of about 1 mTorr to about 100 mTorr. The atmosphere of process gas within vacuum chamber 14 may be held static at the operating vacuum pressure or, alternatively, process gas may be supplied with a suitable flow rate through gas inlet 26 while the processing space 16 is continuously pumped by the vacuum pumping system 24 to maintain the operating vacuum pressure.

According to the present invention, the plasma source 12 is provided in the top of the chamber wall 15 of vacuum chamber 14 and has a generally facing relationship with substrate 20. Plasma source 12 is operable and configured for coupling RF energy into vacuum processing space 16. The top of the vacuum chamber 14 has an annular slot or opening 38 collectively defined by an outer peripheral edge 35a of an inner circular disk 36 and an inner peripheral edge 35b of an outer annular disk 37. The annular opening 38 is sealed by an RF-transmissive window having the U-shaped geometry of an annular trough 30 and formed of a dielectric material such as a quartz or an alumina. The annular trough 30 extends toward the substrate 20 and is in communication with the vacuum processing space 16. Located adjacent an inner dielectric wall 31 and an outer dielectric wall 32 of the trough 30 are an inner and an outer deposition shield 39 and 40, respectively. An annular dielectric disk 33 interconnects the inner and outer dielectric walls 31 and 32 and the inner and outer deposition shields 39 and 40 are interconnected by a ring-shaped annular wall 41. An inductive element 34 is substantially helically or solenoidally disposed within the trough 30 and located between the inner and outer dielectric walls 31 and 32.

The inner and outer dielectric walls 31 and 32 of the trough 30 are each substantially cylindrical and are substantially concentric with respect to a center axis 45. An outer peripheral surface of outer dielectric wall 32 is generally coextensive with an inner peripheral surface of the outer deposition shield 40. Likewise, an inner peripheral surface of inner dielectric wall 31 is generally coextensive with an outer peripheral surface of the inner deposition shield 39. Provided at the top of the inner dielectric wall 31 is an inner circular flange 57 that projects radially inwardly toward the center axis 45. Also provided at the top of the outer dielectric wall 32 is an outer circular flange 58 that projects radially outwardly away from the center axis 45. The inner and outer flanges 57 and 58 overlap the top of the chamber wall 15 to provide mechanical support and to participate in a vacuum-tight seal between the annular trough 30 and the inner and outer disks 36 and 37.

Figure 1A:
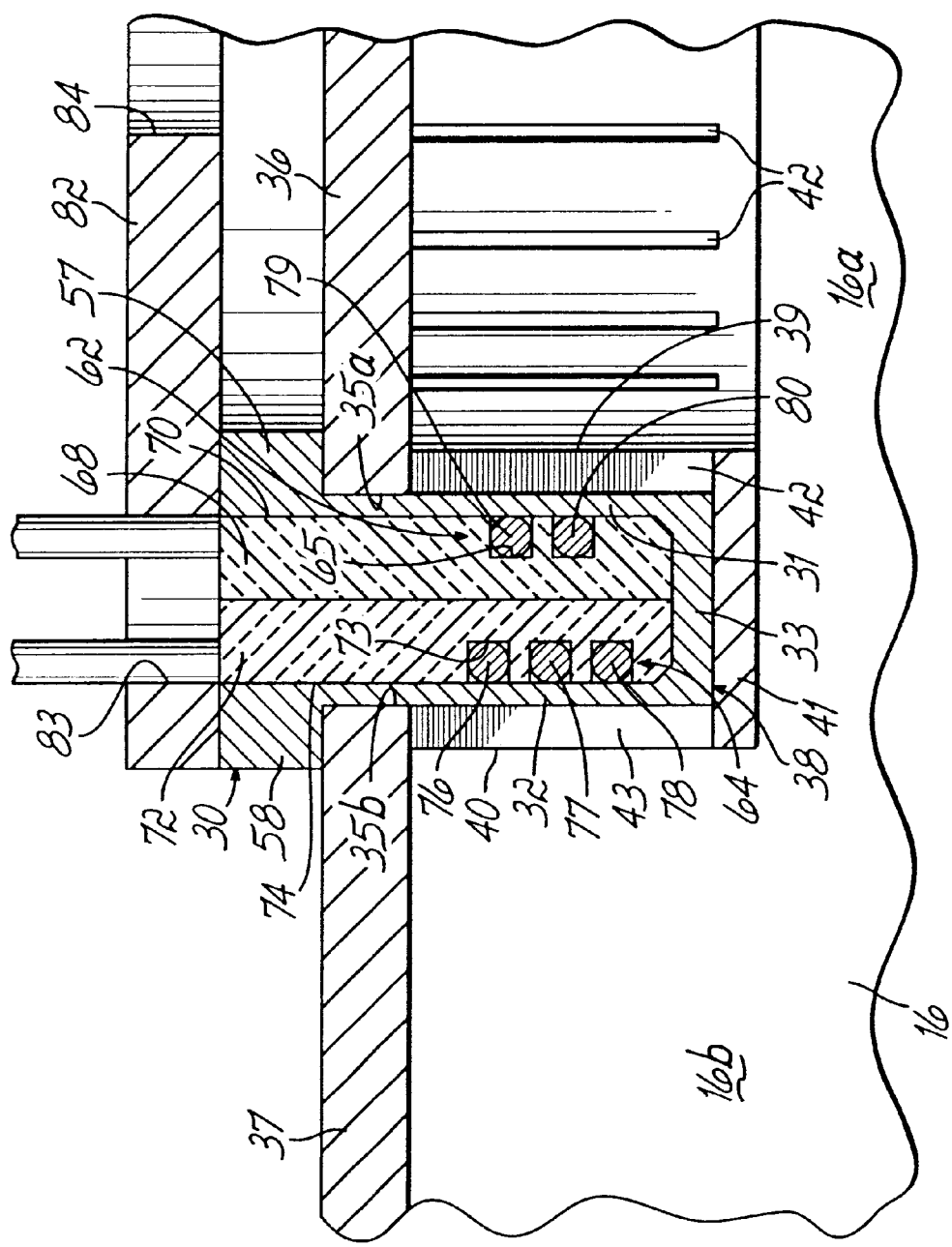
FIG. 1A is an enlarged view of a portion of the plasma processing system of FIG. 1.

As best shown in FIG. 1A, the inner deposition shield 39 projects axially into the processing space 16 and generally toward the substrate 20 from a plane containing inner circular disk 36. Likewise, the outer deposition shield 40 projects axially into the processing space 16 and generally toward the substrate 20 from a plane containing outer annular disk 37. The inner and outer deposition shields 39 and 40 are substantially cylindrical structures that extend substantially parallel to the central axis 45. Inner deposition shield 39 is penetrated by a plurality of first slots 42 and the outer deposition shield 40 is penetrated by a plurality of second slots 43. Each of the first and second slots 42 and 43 has a longitudinal axis that is oriented substantially parallel to the central axis 45. First and second slots 42 and 43 also have a predetermined circumferential spacing, shape and size, that may be similar or dissimilar. Inner and outer deposition shields 39 and 40 are grounded and are preferably constructed of a material of high electrical conductivity, such as an aluminum alloy, but may be formed of a material of lower electrical conductivity coated by a highly conductive material, such as a silver coating on a stainless steel, in areas near slots 42 and 43.

Inner and outer deposition shields 39 and 40 protect the inner and outer dielectric walls 31 and 32 from interactions with the plasma created within the vacuum processing space 16. Deposition shields, such as inner and outer deposition shields 39 and 40, are known to enhance inductive coupling of the magnetic field component of the RF energy with the plasma and suppress capacitive coupling of the electric field component of the RF energy with the plasma. Capacitive coupling of the RF energy produces conditions that accelerate charged particles to high kinetic energies capable of damaging the substrate 20. Slots 42 and 43 inhibit the induction of eddy currents in the deposition shields 39 and 40 that would reduce coupling of RF energy from the inductive element 34 to the plasma. In ICP plasma processing systems that deposit a coating material onto substrate 20, slots 42 and 43 may be provided as tortuous, no-line-of-sight paths such that the trough 30 is protected from receiving an unwanted layer of coating material that could otherwise form a conductive coating that would, among other effects, reduce coupling of RF energy from the inductive element 34 to the plasma. U.S. patent application Ser. No. 09/650,532, entitled Process Apparatus and Method for Improving Plasma Distribution And Performance in an Inductively Coupled Plasma Using an Internal Inductive Element, and filed on Aug. 30, 2000, illustrates slots having no-line-of-sight paths for a deposition shield.

Inductive element 34 is operably connected through an impedance matching unit 60 to an RF power supply 61. The RF power supply 61 typically operates at a frequency between about 400 kHz and about 13.56 MHz and at a power between about 100 watts and about 5000 watts. Matching unit 60 is an electrical circuit familiar to those of ordinary skill in the art that accommodates the temporally-varying impedances of RF power supply 61 and inductive element 34. Matching unit 60 is configured to optimize the RF power applied to the inductive element 34 and to optimize the RF energy transferred into the vacuum processing space 16 under the dynamic electrical load presented by the plasma.

Figure 2:
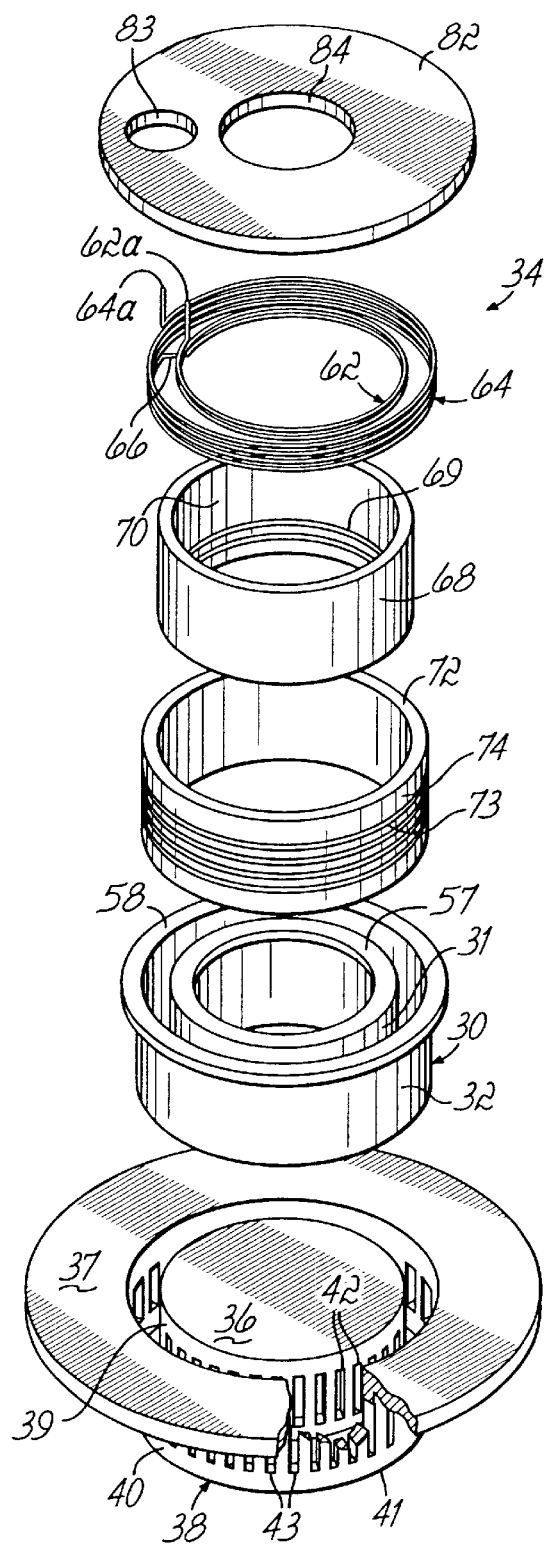
FIG. 2 is a exploded perspective view of the plasma processing system of FIG. 1.

Inductive element 34, according to the present invention and illustrated in FIGS. 1, 1A, and 2, includes an inner coil 62 positioned adjacent the inner dielectric wall 31 of trough 30 and an outer coil 64 positioned adjacent the outer dielectric wall 31 of trough 30. Inner coil 62 is joined for electrical continuity with outer coil 64 by a radially-extending coil segment 66. The inner coil 62 is secured by an inner coil positioner 68 mounted within a helical, circumferential groove 69 inscribed in an inner surface 70. Similarly, outer coil 64 is mounted within a helical, circumferential groove 73 inscribed in an outer surface 74 of an outer coil positioner 72. Grooves 69 and 73 are suitably dimensioned and positioned to receive coils 62 and 64, respectively. Coil positioners 68 and 72 mechanically stabilize and support coils 62 and 64, respectively, and electrically isolate coils 62 and 64 to prevent arcing or other unwanted electrical discharges. To that end, inner and outer coil positioners 68 and 72 are formed of an electrically insulating material, such as a dielectric or a non-conductive polymer and, more specifically, a non-conductive polymer such as polytetrafluoroethylene (PTFE).

The inner and outer coils 62 and 64 terminate with an inner coil end 62a and an outer coil end 64a, respectively, project axially upward for operable connection to the RF power supply 61. Those of ordinary skill in the art will appreciate that each of the inner and outer coils 62 and 64 may be connected to separate RF power supplies, similar to RF power supply 61. In this instance, each of coils 62 and 64 may be independently biased with RF power from one of the RF power supplies.

Figure 3B:
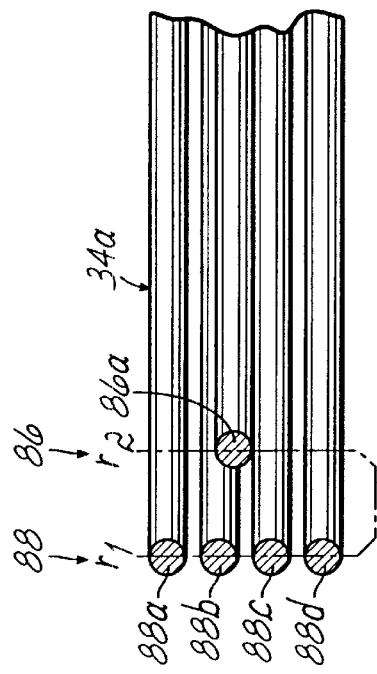
FIG. 3B is a side cross-sectional view of an alternative embodiment of an inductive element arrangement for a plasma source in accordance with the present invention.
Figure 3A:
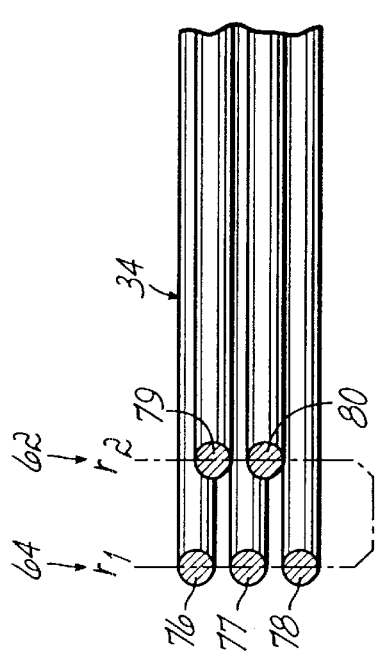
FIG. 3A is a side cross-sectional view of the inductive element arrangement of FIG. 1.

The inner coil 62 and the outer coil 64 are concentrically disposed with respect to the central axis 45 in the geometry of a helix or a solenoid. As best shown in FIGS. 1A and 3A, outer coil 64 includes an upper coil turn 76, an intermediate coil turn 77, and a lower coil turn 78 that have respective centers aligned substantially axially at a first radius, $r_1$, with respect to the central axis 45 and that have roughly equivalent spacing or pitch axially. Inner coil 62 includes an upper coil turn 79 and a lower coil turn 80 that have centers aligned substantially axially at a second radius, $r_2$, with respect to the central axis 45, wherein first radius, $r_1$, is greater than second radius, $r_2$. Coil turns 79 and 80 of inner coil 62 are offset along the axial direction relative to outer coil 64 so that upper coil turn 79 is axially positioned between the intermediate coil turn 77 and upper coil turn 76 and lower coil turn 80 lies between the intermediate coil turn 77 and lower coil turn 78. The longitudinal axes of slots 42 and 43 are oriented substantially perpendicular to the helical coil turns of coils 62 and 64. It is appreciated by those of ordinary skill that the number of coil turns, pitch, and axial positioning of inner coil 62 or outer coil 64, or both, may be changed to vary the characteristics of the inductive coupling with a plasma in vacuum processing space 16. Further, the radial location of one or all of coil turns 76, 77, 78, 79 and 80 with respect to central axis 45 may be varied without departing from the spirit and scope of the present invention.

Inductive element 34 may assume the form of an elongated wire or a hollow tubing and is composed of a material of a low electrical resistivity, such as copper. Inductive element 34 is configured and shaped in accordance with the present invention to inductively couple energy into a vacuum chamber of a plasma processing system when RF power is applied to the inductive element 34. If the inductive element 34 is formed of a hollow tubing, a coolant fluid such as chilled water or a gas may be circulated under pressure through the coolant passage provided by the interior of the hollow tubing. The coolant fluid absorbs heat from the vicinity of the inductive element 34 and transfers the heat to a remote location for dissipation. The removal of the heat maintains the inductive element 34 and its immediate surroundings at a more constant operating temperature. The warmed coolant fluid may be cooled by a heat exchanger (not shown) and recirculated through the tubing. Because the inductive element 34 is positioned outside of the vacuum processing space 16, a fluid leak in the hollow tubing cannot compromise the integrity of the vacuum within the vacuum chamber 14.

According to the present invention, the positioning of inductive element 34 within the annular trough 30 geometrically immerses the inner and outer coils 62 and 64 into the plasma within the vacuum processing space 16. The plasma immersion significantly enhances the efficiency of the coupling of RF energy from the inductive element 34 to the plasma. Moreover and with reference to FIG. 1, the vacuum processing space 16 is separated into two distinct processing zones, indicated generally by reference numerals 16a and 16b. Inner coil 62 provides the primary coupling of RF energy with zone 16a and outer coil 64 provides the primary coupling of RF energy with zone 16b. Thus, the spatial distribution of the RF energy can be separately tailored in each of zones 16a and 16b.

Referring to FIGS. 1, 1A and 2, a supporting cover 82 is positioned axially above and rests on an upper surface of the flanges 57 and 58 of the trough 30. The supporting cover 82 includes a first access opening 83 offset from the central axis 45 that is present to permit electrical connection of the inner and outer coil ends 62a and 64a with the RF power supply 61. The supporting cover 82 also includes a second access opening 84 for receiving and supporting an additional component (not shown) of the plasma processing system 10. For example, in an IPVD system, the inner circular disk 36 may further include an opening (not shown), that is accessible through access opening 84, for receiving a deposition source operable to provide coating material for depositing on substrate 20. The supporting cover 82 is preferably formed of a conductive material, such as a metal or, more specifically, an aluminum alloy, to prevent spurious RF emissions from the inductive element 34 and to electromagnetically decouple the RF fields of the inductive element 34 from the surrounding environment.

In operation, RF power supply 61 is energized to apply RF power to the inductive element 34. The inductive element 34 radiates RF energy that is transmitted through the inner and outer dielectric walls 31 and 32 of trough 30 and the inner and outer deposition shields 39 and 40 to couple with the process gas in vacuum processing space 16. After a plasma is initiated from the process gas, the RF energy emanating from the inductive element 34 inductively couples with the plasma in vacuum processing space 16. In accordance with known ICP principles, the varying magnetic field of the inductively-coupled RF energy initiates the plasma, comprising ions and electrons of a relatively high density, from the process gas and thereafter sustains the plasma. The plasma is then utilized for processing the substrate 20 positioned on substrate support 18.

According to the present invention, the inductive coupling characteristics of a plasma source, such as plasma source 12, may be tailored by modifying the structural configuration. To that end, the distribution of RF energy that is coupled from inductive element 34 with the plasma in processing space 16 can be modified by altering the configuration of the inductive element 34, the configuration of the inner and outer dielectric walls 31 and 32 of the trough 30, the configuration of one or both of the inner and outer deposition shields 39 and 40, or some combination thereof.

In accordance with the present invention, the number, the pitch or the axial position of either the inner coil 62, the outer coil 64, or both, can be varied to tailor the inductive coupling of RF energy with the plasma in vacuum processing space 16. Referring to FIG. 3B, an inductive element, indicated generally by reference numeral 34a, according to the present invention is illustrated for use with plasma source 12 and ICP plasma processing system 10 (FIG. 1). Inductive element 34a comprises an inner coil 86 consisting of a coil turn 86a and an outer coil 88 consisting of an upper coil turn 88a, two intermediate coil turns 88b and 88c, and a lower coil turn 88d, where coil turns 88a–88d have an approximately equal pitch or spacing. Coils 86 and 88 are electrically continuous and disposed in a substantially helical or solenoidal pattern about central axis 45 (FIG. 1). For example, coils 86 and 88 may be electrically connected by a coil segment (not shown) similar to coil segment 66 (FIG. 2). Coil turn 86a is positioned axially between coil turns 88b and 88c. However, the axial position of coil turn 86a relative to outer coil 88 may be varied without departing from the spirit and scope of the present invention. A variation in the axial position of coil 86a will change the spatial characteristics of the inductive coupling with the plasma in vacuum processing space 16 (FIG. 1).

Figure 4B:
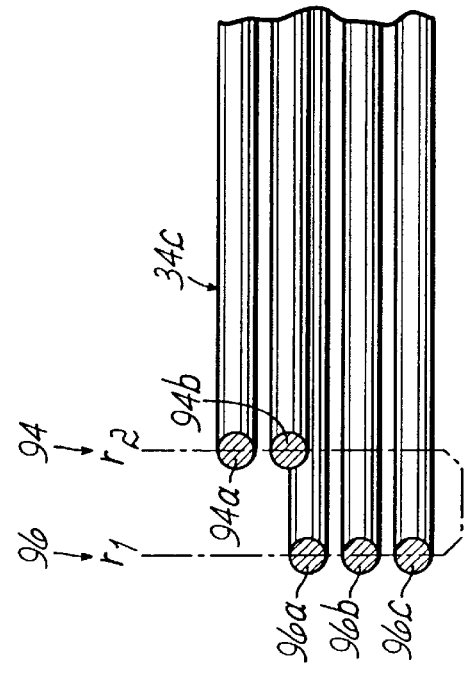
FIG. 4B is a side cross-sectional view of an alternative embodiment of an inductive element arrangement for a plasma source in accordance with the present invention.
Figure 4A:
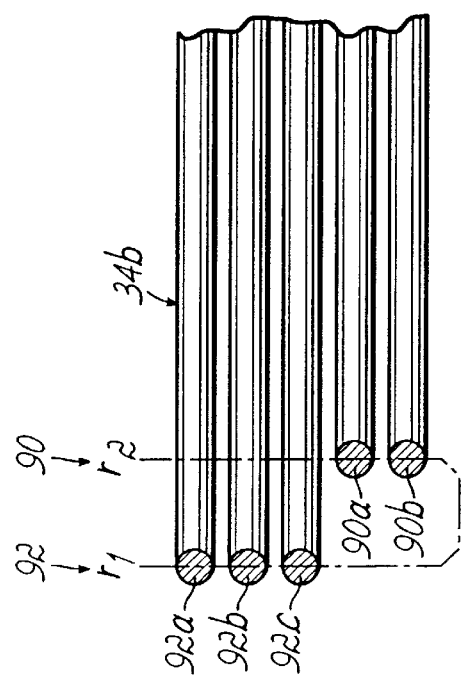
FIG. 4A is a side cross-sectional view of an alternative embodiment of an inductive element arrangement for a plasma source in accordance with the present invention.

Referring to FIG. 4A, an inductive element 34b of the present invention may be used with the plasma source 12 and ICP plasma processing system 10 (FIG. 1). Inductive element 34b comprises an inner coil 90 having an upper coil turn 90a and a lower coil turn 90b and an outer coil 92 having an upper coil turn 92a, an intermediate coil turn 92b, and a lower coil turn 92c. Coil 90 is axially positioned below the outer coil 92. Coil 92 and coil 90 are positioned at a first radius, $r_1$, and at a second radius, $r_2$, respectively relative to the central axis 45 (FIG. 1), wherein the first radius, $r_1$, is greater than the second radius, $r_2$. According to the present invention, the axial position of coils 90 and 92 can be varied to tailor the spatial characteristics of the inductive coupling of RF energy with the plasma in vacuum processing space 16 (FIG. 1).

With reference to FIG. 4B, inductive element 34c is shown in which an inner coil 94, similar to inner coil 90, has been repositioned axially to a location axially above an outer coil 96, similar to outer coil 92. Inner coil 94 comprises an upper coil turn 94a and a lower coil turn 94b. Outer coil 96 comprises an upper coil turn 96a, an intermediate coil turn 96b and a lower coil turn 96c. Coil 96 and coil 94 are positioned at a first radius, $r_1$, and at a second radius, $r_2$, respectively relative to the central axis 45 (FIG. 1), wherein the first radius, $r_1$, is greater than the second radius, $r_2$. Compared with inductive element 34b (FIG. 4A), the axial repositioning of coils 94 and 96 relative to each other axially tailors the spatial characteristics of the inductive coupling of RF energy with the plasma in each of processing zones 16a and 16b of vacuum processing space 16 (FIG. 1).

In accordance with the present invention and with reference to FIGS. 1, 1A, 2 and 3A, the inductive coupling characteristics of the plasma source 12 may be tailored by varying the thickness of the trough 30 and, more specifically, varying the thickness of the inner dielectric wall 31, the thickness of the outer dielectric wall 32, or the thickness of both dielectric walls 31 and 32. Further, the variation in the thickness of dielectric walls 31 and 32 may be combined with differing configurations of either the inductive element 34 or the inner and outer deposition shields 39 and 40 to further tailor the inductive coupling of the RF energy into vacuum processing space 16. As familiar to those of ordinary skill in the art of plasma processing, the amount of RF energy penetrating through a dielectric material is a function of the thickness of the material. Thus, the amount of RF energy inductively transmitted to a plasma through the dielectric walls 31 and 32 may be controlled and tailored by varying the thickness of the dielectric material.

A trough 30a is illustrated with reference to FIG. 5A. Trough 30a is similar to trough 30 (FIG. 1) and is illustrated in combination with inductive element 34 (FIG. 1). Trough 30a has an inner dielectric wall 31a and an outer dielectric wall 32a that are joined by an annular dielectric disk 33a, an inner flange 57a, and an outer flange 58a. Dielectric walls 31a and 32a have a uniform thickness of dielectric material along the axial dimension and are aligned substantially parallel to the central axis 45 (FIG. 1). However, the inner dielectric wall 31a is formed of a greater thickness of dielectric material than outer dielectric wall 32a. As a result, the RF energy from coil turns 79 and 80 of the inner coil 62 must penetrate a greater thickness of dielectric material than RF energy from the coil turns 76, 77, and 78 of the outer coil 64 to couple with the plasma in the processing space 16. If coils 62 and 64 are electrically continuous and powered by RF power source 61 (not shown), the thickness of inner and outer dielectric walls 31a and 32a can be varied to tailor the spatial distribution of the RF energy transferred to different portions of vacuum processing space 16 and, in particular, to tailor the RF energy transferred to zones 16a and 16b (FIG. 1). Because the plasma density depends on the RF energy, accordingly, trough 30a may be used to tailor the spatial distribution of the plasma density in processing space 16 and, in particular, the spatial distribution of the plasma density in zones 16a and 16b (FIG. 1). Those of ordinary skill in the art understand that trough 30a is not limited to use with inductive element 34 but may be used with other inductive elements similar to inductive element 34.

Figure 5B:
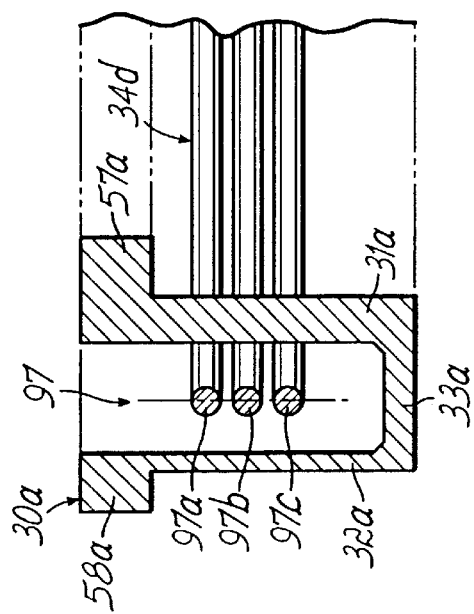
FIG. 5B is a side cross-sectional view of an alternative embodiment of a trough and an inductive element arrangement for a plasma source in accordance with the present invention.
Figure 5A:
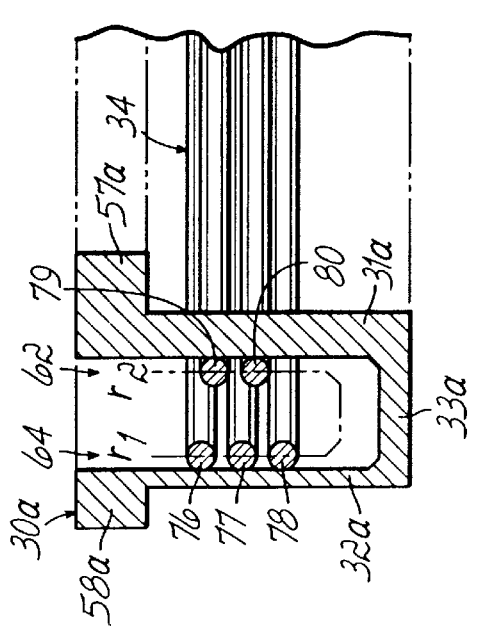
FIG. 5A is a side cross-sectional view of an alternative embodiment of a trough and an inductive element arrangement for a plasma source in accordance with the present invention.

Referring to FIG. 5B, an inductive element, indicated generally by reference numeral 34d, is provided for use with the trough 30a. Inductive element 34d comprises a coil 97 having a single column of coil turns 97a–c that are aligned substantially parallel to the central axis 45 (FIG. 1). Although inductive element 34d is radially centered between the inner dielectric wall 31a and the outer dielectric wall 32a of trough 30a, the present invention is not so limited. As a result of the differential in thickness between the dielectric walls 31a and 32a, RF energy emanating from coil 97 must penetrate a greater thickness of dielectric material in traversing dielectric wall 31a as compared to dielectric wall 32a to couple with the plasma in the processing space 16. Accordingly, the combination of coil 97 and trough 30a provides disparate densities of RF energy to zones 16a and 16b (FIG. 1) and, thereby, tailors the spatial distribution of the plasma density in processing space 16.

Figure 6B:
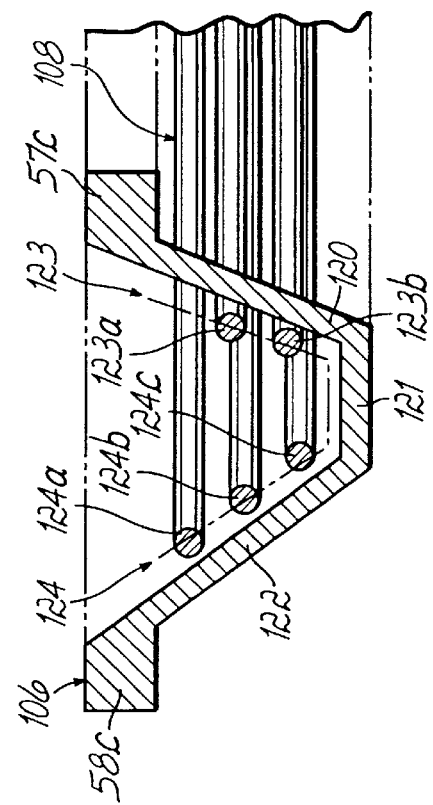
FIG. 6B is a side cross-sectional view of the inductive element arrangement of FIG. 8A.
Figure 6A:
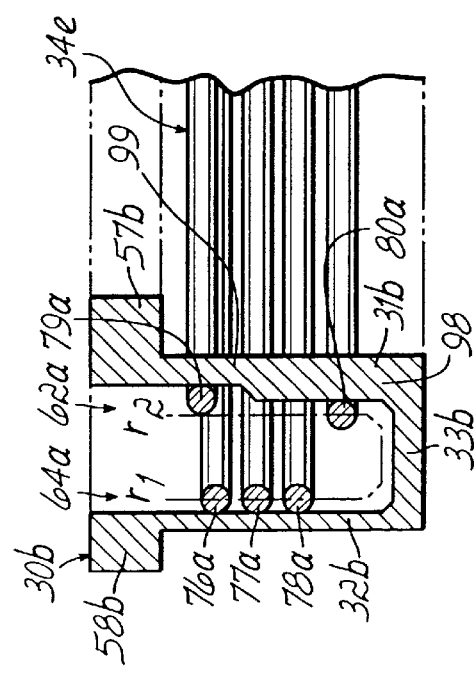
FIG. 6A is a side cross-sectional view of an alternative embodiment of a trough and an inductive element arrangement for a plasma source in accordance with the present invention.

With reference to FIG. 6A, a trough 30b, similar to the trough 30 (FIGS. 1, 1A, and 2) and trough 30a (FIGS. 5A and 5B), is provided for use with an inductive element, indicated generally by reference numeral 34e. Trough 30b has an inner dielectric wall 31b and an outer dielectric wall 32b that are joined by an annular dielectric disk 33b, an inner flange 57b, and an outer flange 58b. Dielectric walls 31b and 32b are aligned substantially parallel to a central axis (not shown but similar to central axis 45) of trough 30b. Outer dielectric wall 32b has a uniform thickness of dielectric material along the axial direction. However, the inner dielectric wall 31b has a modulated thickness of dielectric material along the axial direction comprising a first axial portion 98 and a second axial portion 99 having a lesser thickness of dielectric material than first axial portion 98. Accordingly, the RF energy penetrating first axial portion 98 is attenuated more than RF energy penetrating second axial portion 99 for a given RF power applied to inductive element 34e. Axial portions 98 and 99 are integral and each of axial portions 98 and 99 provide a greater thickness of dielectric material than outer dielectric wall 32b. As a result, the RF energy emanating from coil turns 79a and 80a of an inner coil 62a must penetrate a greater thickness of dielectric material than RF energy emanating from the coil turns 76a, 77a and 78a of an outer coil 64a, similar to outer coil 64 (FIG. 3A), to couple with the plasma in the processing space 16. If coils 62a and 64a are electrically continuous and powered by RF power source 61 (FIG. 1), the thickness of dielectric walls 31 and 32 can be varied and modulated to tailor the spatial distribution of the RF energy transferred to different portions of vacuum processing space 16. Because the plasma density at any position in processing space 16 depends on the density of the RF energy transferred, trough 30b may be used to tailor the spatial distribution of the plasma density in zones 16a and 16b (FIG. 1).

With continued reference to FIG. 6A, coil turn 79a is offset radially and has a lesser radius with respect to the central axis (not shown) than coil turn 80a. The RF energy from coil turn 79a must penetrate a smaller thickness of dielectric material presented by second axial portion 99 than RF energy from coil turn 80a which must penetrate a larger thickness of dielectric material presented by first axial portion 98. Because the RF magnetic field varies with thickness, the RF energy transferred into vacuum processing space 16 is tailored axially adjacent the inner dielectric wall 31b due to the modulation of the dielectric thickness afforded by first and second axial portions 98 and 99. Those of ordinary skill in the art will understand that the thickness of the dielectric material comprising inner dielectric wall 31b can be modulated axially in any number of portions with differing thicknesses and may have a tapered thickness rather than a uniform thickness. Those of ordinary skill in the art will further understand that the thickness of outer dielectric wall 32b may be modulated axially, similar to the modulation of inner dielectric wall 31b, without departing from the spirit and scope of the present invention.

According to the present invention, the characteristics of the inductive coupling between coil 34 and the plasma can be tailored by altering the number, circumferential spacing, or opening size of the plurality of the first slots 42 in inner deposition shield 39 or the plurality of the second slots 43 in outer deposition shield 40. Referring to FIG. 7A, an inner deposition shield 39a, similar to inner deposition shield 39, includes a plurality of first slots 44 that are unobstructed and generally rectangular. Similarly, an outer deposition shield 40a, similar to inner deposition shield 40, is perforated by a plurality of second slots 46 that have unobstructed openings and are generally rectangular. Slots 44 and 46 are elongated parallel to the central axis 45 of the trough 40 (FIG. 1) and have substantially equal spacings about the circumference of the inner and outer deposition shields 39a and 40a, respectively.

Figure 7B:
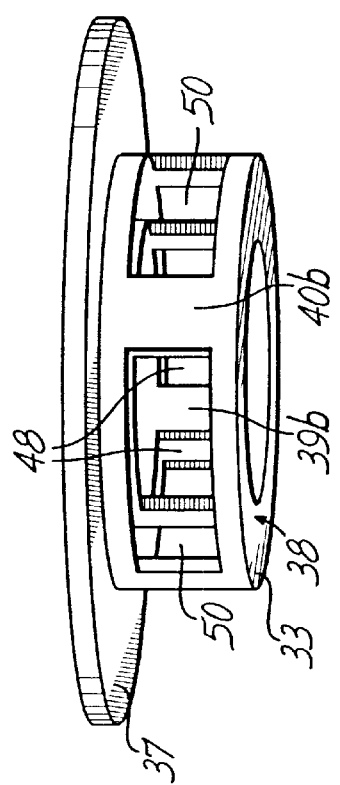
FIG. 7B is a perspective view of an alternative embodiment of a pair of deposition shields for a plasma source in accordance with the present invention.
Figure 7A:
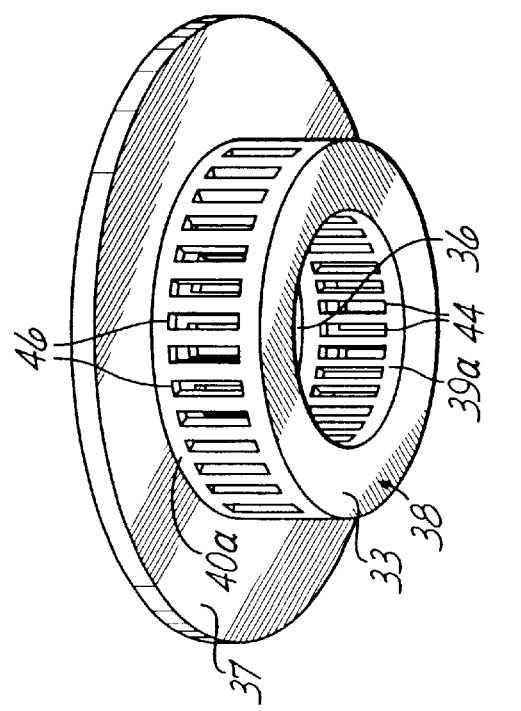
FIG. 7A is a perspective view of an alternative embodiment of a pair of deposition shields for a plasma source in accordance with the present invention.

Referring to FIG. 7B, an inner deposition shield 39b, similar to inner deposition shield 39, includes a first plurality of slots 48 and the outer deposition shield 40b, similar to outer deposition shield 39, includes a plurality of second slots 50. Slots 48 and 50 are elongated with their major dimension oriented circumferentially relative to the central axis 45 of the trough 40 (FIG. 1). Slots 48 and 50 have unobstructed openings and are generally rectangular and substantially equally spaced about the circumference of the inner and outer deposition shields 39b and 40b, respectively. The slots 44 and 46 and the slots 48 and 50 provide paths for transmitting RF energy from inductive element 34 through trough 30 into the vacuum processing space 16 (FIG. 1) to couple with the plasma. As the size of slots 44 and 46 or slots 48 and 50 increases, the capacitive coupling of RF energy to the plasma is enhanced.

Figures 8A, 8B:
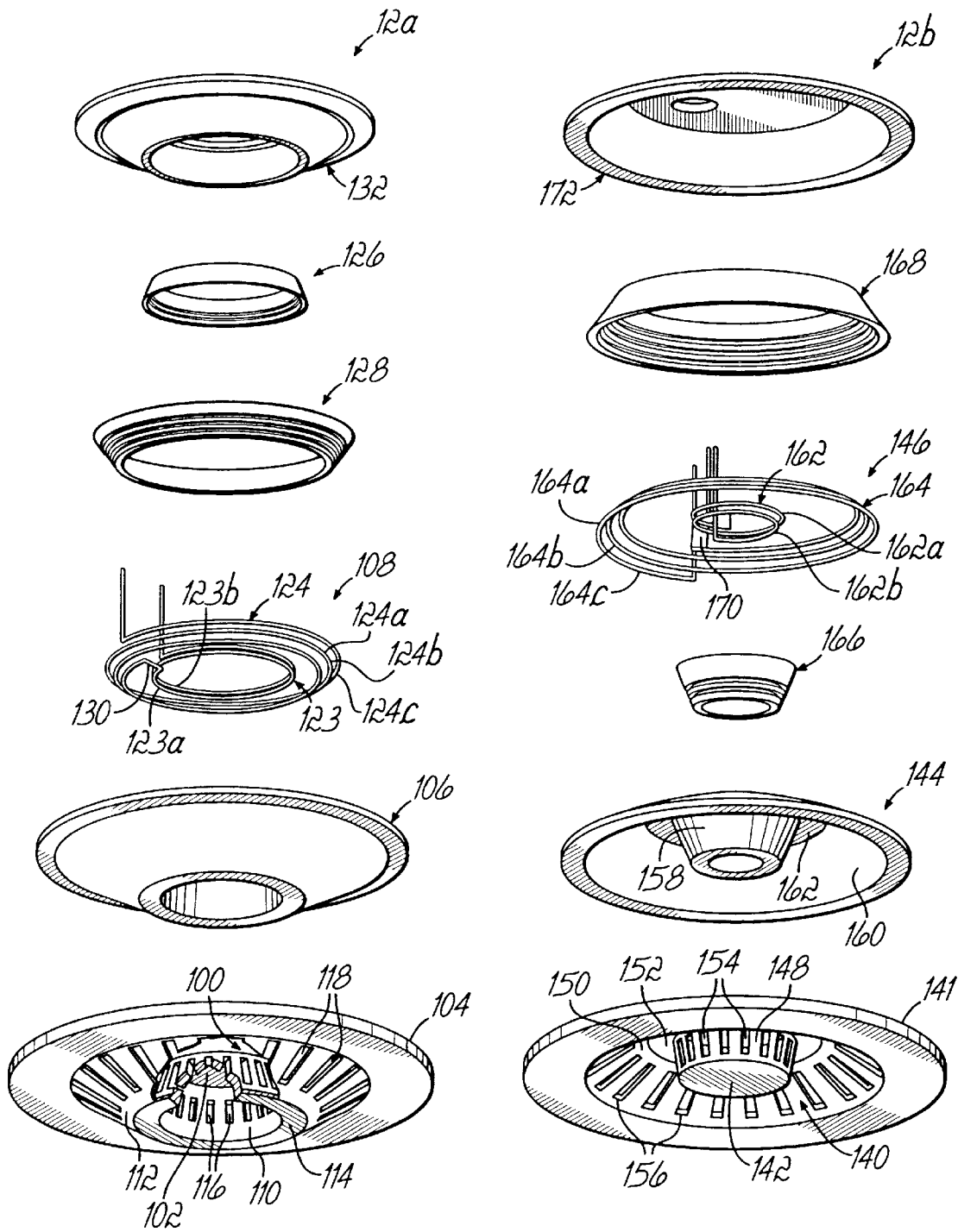
FIG. 8A is an exploded perspective view of an alternative embodiment of a plasma source in accordance with the present invention.
FIG. 8B is an exploded perspective view of an alternative embodiment of a plasma source in accordance with the present invention.

A plasma source, indicated generally by reference numeral 12a and similar to plasma source 12 (FIG. 1), for initiating and sustaining a plasma in an ICP plasma processing system, such as ICP plasma processing system 10, is illustrated in FIG. 8A. Plasma source 12a is positioned in an annular opening 100 provided between the outer periphery of a circular inner disk 102 and the inner periphery of an annular outer disk 104. Plasma source 12a includes a trough 106 positioned within annular opening 100, an inductive element 108 positioned within the trough 106, an inner frustoconical deposition shield 110 and an outer frustoconical deposition shield 112. Inner and outer frustoconical deposition shields 110 and 112 are joined by a ring-shaped wall 114 and have respective inclination angles that provide a biconical structure. Inner frustoconical deposition shield 110 includes a plurality of first slots 116 and outer frustoconical deposition shield 112 includes a plurality of second slots 118. The slots 114 and 116 are configured as known in the art as deposition shields for eliminating or reducing the capacitive coupling of RF energy from inductive element 108 into the vacuum processing space 16 (FIG. 1).

The trough 106 is adapted and dimensioned to fit within opening 100 in a vacuum-tight fashion. As best shown in FIG. 6B, trough 106 has an inner frustoconical dielectric wall 120 interconnected to an outer frustoconical dielectric wall 122 by an annular disk 121, an inner circular flange 57c, and an outer circular flange 58c. The inclination angles of the inner and outer frustoconical dielectric walls 120 and 122 are selected to closely conform to the inclination angles of the inner and outer frustoconical deposition shields 110 and 112, respectively. Although each of the inner and outer frustoconical dielectric walls 120 and 122 are illustrated as having a uniform thickness, the respective thicknesses may be varied to tailor the inductive coupling of RF energy emanating from inductive element 108 to the plasma in vacuum processing space 16 (FIG. 1). Moreover, the inclination angles of the inner and outer frustoconical dielectric walls 120 and 122 may be varied to tailor the spatial characteristics of the inductive coupling of RF energy from inductive element 108 into processing space 16.

Referring to FIGS. 6B and 8A, the inductive element 108 includes an inner coil 123 positioned adjacent to inner frustoconical dielectric wall 120 and an outer coil 124 positioned adjacent to outer frustoconical dielectric wall 122. Inner coil 123 is captured by an inner frustoconical coil positioner 126, similar to inner coil positioner 68 (FIG. 1), and outer coil 124 is captured by an outer frustoconical coil positioner 128, similar to inner coil positioner 72 (FIG. 1). Frustoconical coil positioners 126 and 128 mechanically stabilize the inductive element 108 within trough 106 and provide electrical isolation that suppresses arcing. Inner and outer coils 123 and 124 are joined for electrical continuity by a radial coil segment 130. Inner coil 123 is illustrated as having two coil turns 123a–b inclined in a column to conform to the shape and the inclination angle of inner frustoconical dielectric wall 120. Similarly, outer coil 124 is illustrated as having three coil turns 124a–c inclined in a column to conform to the shape and the inclination angle of the outer frustoconical dielectric wall 122. However, the number, pitch, axial position, and radial positioning of the coil turns 123a–b and 124a–c may be varied without departing from the spirit and scope of the present invention. Referring to FIG. 8A, a supporting cover 132, formed of a metal such as aluminum alloy, is mounted axially above the inductive element 108 to limit or eliminate external emissions of RF energy from inductive element 108.

A plasma source 12b, similar to plasma sources 12 (FIG. 1) and 12a (FIG. 8A), for initiating and sustaining a plasma in an ICP plasma processing system, such as ICP plasma processing system 10, is illustrated in FIG. 8B. Plasma source 12b is positioned in an annular opening 140 between the inner periphery of an annular outer disk 141 and the outer periphery of an inner circular disk 142. Plasma source 12b includes a trough 144 positioned within annular opening 140, an inductive element 146, and an inner frustoconical deposition shield 148 joined to an outer frustoconical deposition shield 150 by an annular disk 152. Inner and outer frustoconical deposition shields 148 and 150 have inclination angles that provide a biconical structure. Inner frustoconical deposition shield 148 includes a plurality of first slots 154 and outer frustoconical deposition shield 150 includes a plurality of second slots 156. The frustoconical deposition shields 154 and 156 are configured for eliminating or reducing the capacitive coupling of RF energy from inductive element 146 into the vacuum processing space 16 (FIG. 1).

The trough 144 is dimensioned to fit within annular opening 140 and is adapted to engage each of the inner and outer frustoconical deposition shields 148 and 150 in a vacuum-tight fashion. Trough 144 has an inner frustoconical dielectric wall 158 joined to an outer frustoconical dielectric wall 160 by an annular disk 162. The inclination angles of the inner and outer frustoconical dielectric walls 158 and 160 of trough 144 are selected to conform to the inclination angles of the inner and outer frustoconical deposition shields 148 and 150, respectively. Although each of the frustoconical dielectric walls 158 and 160 are illustrated with a uniform thickness, the respective thicknesses of each may be varied to tailor the inductive coupling of RF energy emanating from inductive element 146 to the plasma in vacuum processing space 16 (FIG. 1).

The inductive element 146 includes an inner coil 162 positioned adjacent to inner frustoconical dielectric wall 158 and an outer coil 164 positioned adjacent to outer frustoconical dielectric wall 160. Inner coil 162 is captured by an inner frustoconical coil positioner 166, similar to inner coil positioner 68 (FIG. 1), and outer coil 164 is captured by an outer frustoconical coil positioner 168, similar to outer coil positioner 72 (FIG. 1). Frustoconical coil positioners 164 and 168 mechanically stabilize the inductive element 146 within trough 144 and provide electrical isolation that suppresses arcing. Coils 162 and 164 are joined for electrical continuity by an arching coil segment 170. Although inner coil 162 is illustrated as having two coil turns 162a–b and outer coil is illustrated as having three coil turns 164a–c, the number, pitch, radial positioning, and axial positioning of the coil turns may be varied without departing from the spirit and scope of the present invention. A supporting cover 172, formed of a metal, is mounted axially above the inductive element 146 and functions to limit or eliminate external emissions of RF energy from inductive element 146.

Figure 9:
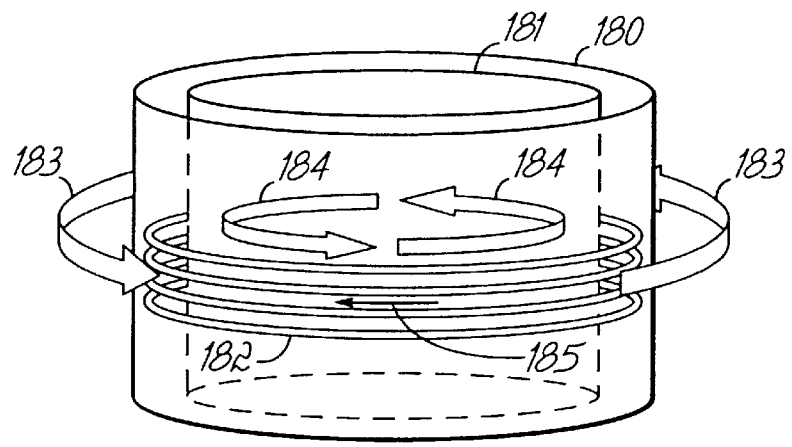
FIG. 9 is a diagrammatic view of the plasma currents induced by a plasma source in accordance with the present invention.

During the operation of a plasma processing system configured with a plasma source of the present invention, such as plasma source 12, plasma currents circulate with circumferential, circular trajectories under the influence of the RF magnetic field and in a direction opposite to the direction of the electrical current in the inductive element at any instant. Referring to FIG. 9, the circulation of plasma currents adjacent and about an outer diameter 180 and an inner diameter 181 of an inductive element 182 is schematically shown as loops 183 and 184, respectively, for an RF current flowing in the direction of arrow 185 through the inductive element 184. Plasma currents in loop 180 circulate in circumferential trajectories countervailing to the circumferential trajectories of plasma currents in loop 181. Within the plasma, the circulating electrons collide with process gas atoms or molecules to create additional positive ions. Because RF energy is bidirectionally transferred with a radial orientation, RF energy is inductively-coupled with electrons in the plasma in a highly efficient fashion. It is understood by those of ordinary skill that inductive element 184 may comprise an inner and an outer coil (not shown but similar to coil 34 (FIG. 1)) and that inductive element 182 is diagrammatically illustrated in FIG. 8.

Figure 10:
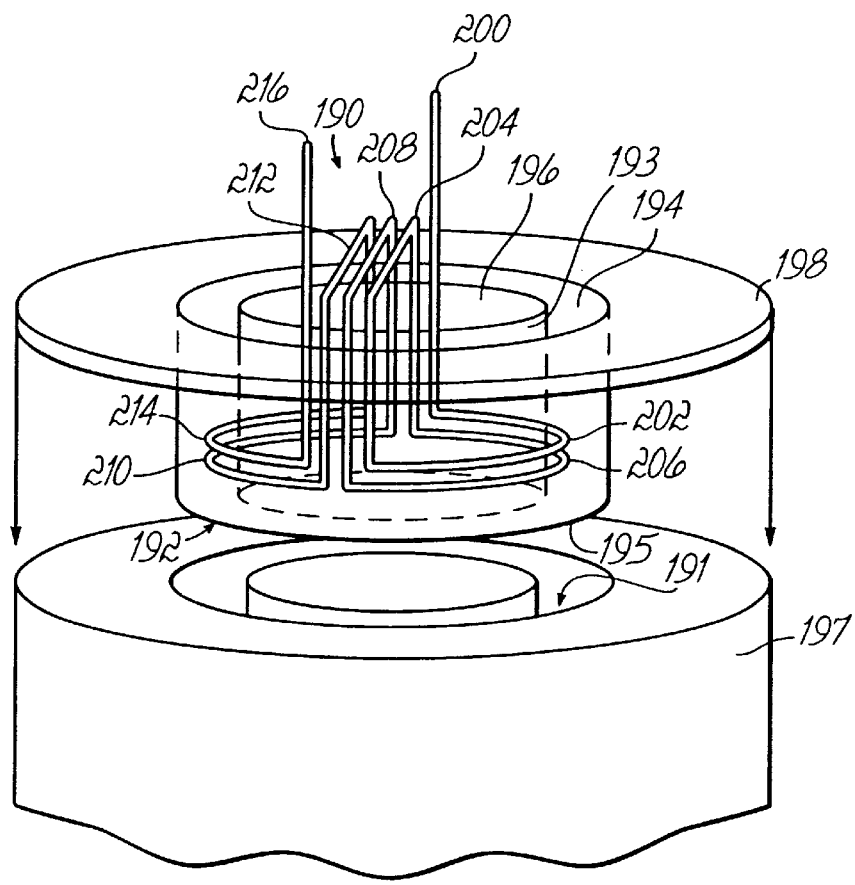
FIG. 10 is a perspective view of an alternative embodiment of an inductive element for a plasma source in accordance with the present invention.

Referring to FIG. 10, a coil, indicated generally by reference numeral 190, is presented for use with a plasma source, such as plasma source 12, according to the present invention. Coil 190 is received by a coil positioner (not shown but similar to inner coil positioner 68) within a trough 192 mounted in an annular opening 191. The trough 192 includes an inner dielectric wall 193 and an outer dielectric wall 194 joined by an annular disk 195. The trough 192 further includes a circular disk 196 that overlies and provides a sealing engagement with a vacuum chamber 197 and an outer annular disk 198. Suitable inner and outer deposition shields (not shown) are located adjacent the inner and outer dielectric walls 193 and 194 and adjacent to circular disk 196 between the coil 190 and the vacuum processing space 16 (FIG. 1) for suppressing capacitive coupling of RF energy with the plasma.

Coil 190 has a first coil end 200 that extends axially for providing an operable connection with RF power supply 61. Coil end 200 is electrically continuous with one end of a semi-circular first coil turn 202 positioned adjacent the inner dielectric wall 193. A second end of first coil turn 202 is electrically continuous with one end of a first coil arch 204 that extends in a first plane axially up the inner dielectric wall 193, over the circular disk 196 and axially down the dielectric wall 193. An opposite end of first coil arch 204 is electrically continuous with one end of a semicircular second coil turn 206 positioned adjacent the inner dielectric wall 193. An opposite end of second coil turn 206 is electrically continuous with one end of a second coil arch 208 that extends in a second plane axially up the inner dielectric wall 193, over the circular disk 196 and axially down the dielectric wall 193. An opposite end of second coil arch 208 is electrically continuous with one end of a semicircular third coil turn 210 positioned adjacent the inner dielectric wall 193. An opposite end of third coil turn 210 is electrically continuous with one end of a third coil arch 212 that extends in a third plane axially up the inner dielectric wall 193, over the circular disk 196 and axially down the dielectric wall 193. An opposite end of third coil arch 212 is electrically continuous with one end of a semicircular fourth coil turn 214 positioned adjacent the inner dielectric wall 193. Fourth coil turn 214 has a second coil end 216 that extends axially to complete the operable connection with RF power supply 61 (FIG. 1). Although the coil 190 is illustrated as closely conforming to the exterior or non-vacuum side of the dielectric window 192, those of ordinary skill in the art understand that coil 190 is not so limited.

When energized, coil 190 is configured to transfer RF energy with diverse portions of the vacuum processing space 16 (FIG. 1) and, in particular, portions of processing zone 16*b* adjacent outer dielectric wall 194, processing zone 16*a* adjacent the inner dielectric wall 193 and processing zone 16*a* adjacent the circular disk 196. Coil arches 204, 208 and 212 emanate RF energy that couples through the circular disk 196 to bolster the distribution of RF energy and the plasma density near the central axis of trough 192 and, particularly, in processing zone 16*a*. Those of ordinary skill in the art of plasma processing will understand that the number, pitch, radial position, and axial position of the coil turns 202, 206, 210, and 214, the number and pattern of arches 204, 208 and 212, and the configuration of the thicknesses of the dielectric walls 193 and 194 may be varied to tailor the inductive coupling of RF energy from the coil 190 to the plasma in vacuum processing space 16 and, in particular, to the plasma in processing zone 16*a*.

While the present invention has been illustrated by the description of several embodiments thereof, and while those embodiments have been described in considerable detail, it is not intended to restrict or in any way limit the scope of the appended claims to such detail. Additional advantages and modifications will readily appear to those skilled in the art. The invention in its broader aspects is therefore not limited to the specific details, and representative apparatus and method shown and described. Accordingly, departures may be made from such details without departing from the scope or spirit of applicant's general inventive concept.

What is claimed is:

1. A system for processing a substrate with a plasma, the system comprising:
    a vacuum chamber having a chamber wall which surrounds a vacuum processing space and a gas inlet for introducing a process gas into said vacuum processing space, said chamber wall having an annular opening therein;
    a substrate support positioned within said vacuum processing space, said substrate support adapted to receive and support the substrate;
    a radiofrequency (RF) energy source;
    an annular dielectric trough positioned in said annular opening in a vacuum-tight fashion, said trough comprising an inner dielectric wall and an outer dielectric wall;
    an inner deposition shield adjacent said inner dielectric wall and within said vacuum chamber;
    an outer deposition shield adjacent said outer dielectric wall and within said vacuum chamber; and
    an inductive element positioned within said trough, said inductive element operably connected to said RF energy source for coupling RF energy through said inner and outer dielectric walls of said trough and said inner and outer deposition shields to the plasma in said vacuum processing space.

2. The system of claim 1, wherein said trough has a central axis and said inductive element comprises a coil having a plurality of coil turns disposed substantially helically about said central axis, said coil turns connected for electrical continuity.

3. The system of claim 2, wherein at least one of said coil turns comprises an inner coil adjacent said inner dielectric wall and at least one of said coil turns comprises an outer coil adjacent said outer dielectric wall, said inner coil having a first number of coil turns and said outer coil having a second number of coil turns.

4. The system of claim 3, wherein said coil turns of the outer coil conform to the shape of a non-vacuum side of said inner dielectric wall.

5. The system of claim 3, wherein said coil turns of the outer coil conform to the shape of a non-vacuum side of said inner dielectric wall.

6. The system of claim 3, wherein the first number of coil turns is smaller than the second number of coil turns.

7. The system of claim 3, wherein the first number of coil turns is equal to the second number of coil turns.

8. The system of claim 3, wherein the first number of coil turns is larger than the second number of coil turns.

9. The system of claim 3, wherein said coil turns adjacent said inner dielectric wall are concentric relative to said central axis of said trough.

10. The system of claim 3, wherein said coil turns adjacent said outer dielectric wall are concentric relative to said central axis of said trough.

11. The system of claim 2, wherein at least two of said coil turns are aligned in a column adjacent said inner dielectric wall.

12. The system of claim 2, wherein at least two of said coil turns are aligned in a column adjacent said outer dielectric wall.

13. The system of claim 2, wherein adjacent pairs of said coil turns have substantially equal spacings parallel to said central axis.

14. The system of claim 1, wherein at least one of said inner and outer dielectric walls has an inclination angle with respect to said central axis.

15. The system of claim 1, wherein the trough has a substantially frustoconical shape and said inner and outer dielectric walls have an inclination angle with respect to said central axis.

16. The system of claim 1, wherein said trough has a central axis and at least one of said inner and outer dielectric walls has a thickness that varies with axial position parallel to said central axis.

17. The system of claim 1, wherein said inner deposition shield comprises a plurality of first slots extending therethrough and said outer deposition shield comprises a plurality of second slots extending therethrough.

18. The system of claim 17, wherein said plurality of first slots and said plurality of second slots, respectively, eliminate line-of-sight paths from said vacuum processing space toward said inner and outer dielectric walls.

19. The system of claim 17, wherein adjacent pairs of said first slots are equally spaced about a circumference of said inner dielectric wall.

20. The system of claim 17, wherein adjacent pairs of said second slots are equally spaced about a circumference of said outer dielectric wall.

21. The system of claim 17, wherein the opening size of at least one of said second slots differs from the opening size of at least one of said first slots.

22. The system of claim 1, further comprising a circular opening positioned peripherally inward of said annular opening and a dielectric window disposed in said circular opening in a vacuum-tight manner, wherein said inductive element comprises a plurality of coil turns adjacent said window.

23. A plasma source for coupling radiofrequency (RF) energy from an RF energy source to a plasma confined within a vacuum processing space, the vacuum processing space surrounded by a chamber wall of a vacuum chamber and the chamber wall having an annular opening therein, the plasma source comprising:

an annular dielectric trough positioned in the annular opening in a vacuum-tight fashion, said trough comprising an inner dielectric wall and an outer dielectric wall;

an inner deposition shield adjacent said inner dielectric wall and within the vacuum chamber;

an outer deposition shield adjacent said outer dielectric wall and within the vacuum chamber; and an inductive element positioned within said trough, said inductive element operably connected to the RF energy source for coupling RF energy through said inner and outer dielectric walls of said trough and said inner and outer deposition shields to the plasma in the vacuum processing space.

24. The plasma source of claim 23, wherein said trough has a central axis and said inductive element comprises a coil having a plurality of coil turns disposed substantially helically about said central axis, said coil turns connected for electrical continuity.

25. The plasma source of claim 24, wherein at least one of said coil turns comprises an inner coil adjacent said inner dielectric wall and at least one of said coil turns comprises an outer coil adjacent said outer dielectric wall, said inner coil having a first number of coil turns and said outer coil having a second number of coil turns.

26. The plasma source of claim 25, wherein said coil turns of the outer coil conform to the shape of a non-vacuum side of said inner dielectric wall.

27. The plasma source of claim 25, wherein said coil turns of the outer coil conform to the shape of a non-vacuum side of said inner dielectric wall.

28. The plasma source of claim 25, wherein the first number of coil turns is smaller than the second number of coil turns.

29. The plasma source of claim 25, wherein the first number of coil turns is equal to the second number of coil turns.

30. The plasma source of claim 25, wherein the first number of coil turns is larger than the second number of coil turns.

31. The plasma source of claim 25, wherein said coil turns adjacent said inner dielectric wall are concentric relative to said central axis of said trough.

32. The plasma source of claim 25, wherein said coil turns adjacent said outer dielectric wall are concentric relative to said central axis of said trough.

33. The plasma source of claim 24, wherein at least two of said coil turns are aligned in a column adjacent said inner dielectric wall.

34. The plasma source of claim 24, wherein at least two of said coil turns are aligned in a column adjacent said outer dielectric wall.

35. The plasma source of claim 24, wherein adjacent pairs of said coil turns have substantially equal spacings parallel to said central axis.

36. The plasma source of claim 23, wherein at least one of said inner and outer dielectric walls is inclined with an inclination angle with respect to said central axis.

37. The plasma source of claim 23, wherein said trough has a central axis and at least one of said inner and outer dielectric walls has a thickness that varies with axial position parallel to said central axis.

38. The plasma source of claim 23, wherein at least one of said inner and outer dielectric walls has an inclination angle with respect to said central axis.

39. The plasma source of claim 23, wherein the trough has a substantially frustoconical shape and said inner and outer dielectric walls have an inclination angle with respect to said central axis.

40. The plasma source of claim 23, herein said trough has a central axis and at least one of said inner and outer dielectric walls has a thickness that varies with axial position parallel to said central axis.

41. The plasma source of claim 23, wherein said inner deposition shield comprises a plurality of first slots extend ing therethrough and said outer deposition shield comprises a plurality of second slots extending therethrough.

42. The plasma source of claim 41, wherein said plurality of first slots and said plurality of second slots, respectively, eliminate line-of-sight paths from said vacuum processing space toward said inner and outer dielectric walls.

43. The plasma source of claim 41, wherein adjacent pairs of said first slots are equally spaced about a circumference of said inner dielectric wall.

44. The plasma source of claim 41, wherein adjacent pairs of said second slots are equally spaced about a circumference of said outer dielectric wall.

45. The plasma source of claim 41, wherein the opening size of at least one of said second slots differs from the opening size of at least one of said first slots.

46. The plasma source of claim 23, further comprising a circular opening positioned peripherally inward of said annular opening and a dielectric window disposed in said circular opening in a vacuum-tight manner, wherein said inductive element comprises a plurality of coil turns adjacent said window.

* * * * *

UNITED STATES PATENT AND TRADEMARK OFFICE
CERTIFICATE OF CORRECTION

PATENT NO. : 6,417,626 B1
DATED : July 9, 2002
INVENTOR(S) : Jozef Brcka et al.

It is certified that error appears in the above-identified patent and that said Letters Patent is hereby corrected as shown below:

Column 16,
Line 62, reads "outer coil" and should read -- inner coil --

Column 17,
Lines 51-52, reads "said window" and should read -- said dielectric window --.

Column 18,
Line 20, reads "outer coil" and should read -- inner coil --.
Line 67, the last word is divided onto the next page without a hyphen, a hyphen should be added between "extend" in column 18 and "ing" in column 19.

Column 20,
Line 9, reads "said window" and should read -- said dielectric window --.

Signed and Sealed this

Fifteenth Day of April, 2003

JAMES E. ROGAN
*Director of the United States Patent and Trademark Office*